United States Patent
Kurashima et al.

(10) Patent No.: US 7,951,717 B2
(45) Date of Patent: *May 31, 2011

(54) POST-CMP TREATING LIQUID AND MANUFACTURING METHOD OF SEMICONDUCTOR DEVICE USING THE SAME

(75) Inventors: Nobuyuki Kurashima, Yokohama (JP); Gaku Minamihaba, Yokohama (JP); Yoshikuni Tateyama, Hiratsuka (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 646 days.

This patent is subject to a terminal disclaimer.

(21) Appl. No.: 11/967,584

(22) Filed: Dec. 31, 2007

(65) Prior Publication Data
US 2008/0216415 A1 Sep. 11, 2008

(30) Foreign Application Priority Data

Mar. 6, 2007 (JP) ................ 2007-056185
Jun. 7, 2007 (JP) ................ 2007-151746

(51) Int. Cl.
*H01L 21/302* (2006.01)
*H01L 21/461* (2006.01)
*C09K 3/14* (2006.01)
*C09G 1/02* (2006.01)

(52) U.S. Cl. ............... 438/692; 51/298; 106/3

(58) Field of Classification Search ........ 106/3; 51/295, 51/298; 438/692
See application file for complete search history.

(56) References Cited

U.S. PATENT DOCUMENTS

| | | | |
|---|---|---|---|
| 6,436,811 B1 * | 8/2002 | Wake et al. ............ | 438/633 |
| 6,858,539 B2 | 2/2005 | Minamihaba et al. | |
| 7,087,562 B2 | 8/2006 | Abe et al. | |
| 7,087,564 B2 * | 8/2006 | Misra et al. ........... | 510/175 |
| 7,655,559 B2 * | 2/2010 | Kurashima et al. ..... | 438/637 |
| 2005/0118819 A1 | 6/2005 | Minamihaba et al. | |
| 2005/0230354 A1 * | 10/2005 | Hardikar ................ | 216/88 |
| 2006/0042502 A1 * | 3/2006 | Sato et al. ............. | 106/10 |
| 2007/0190770 A1 | 8/2007 | Kurashima et al. | |

* cited by examiner

*Primary Examiner* — Jerry Lorengo
*Assistant Examiner* — Shuangyi Abu Ali
(74) *Attorney, Agent, or Firm* — Oblon, Spivak, McClelland, Maier & Neustadt, L.L.P.

(57) ABSTRACT

Post-CMP treating liquids are provided, one of which includes water, an amphoteric surfactant, an anionic surfactant, a complexing agent, resin particles having carboxylic group and sulfonyl group on their surfaces, a primary particle diameter thereof ranging from 10 to 60 nm, and tetramethyl ammonium hydroxide. Another includes water, polyphenol, an anionic surfactant, ethylene diamine tetraacetic acid, resin particles having carboxylic group and sulfonyl group on their surfaces, a primary particle diameter thereof ranging from 10 to 60 nm, and tetramethyl ammonium hydroxide. Both of the treating liquids have a pH ranging from 4 to 9, and exhibit a polishing rate both of an insulating film and a conductive film at a rate of 10 nm/min or less.

9 Claims, 1 Drawing Sheet

POST-CMP TREATING LIQUID AND MANUFACTURING METHOD OF SEMICONDUCTOR DEVICE USING THE SAME

CROSS-REFERENCE TO RELATED APPLICATIONS

This application is based upon and claims the benefit of priority from prior Japanese Patent Applications No. 2007-056185, filed Mar. 6, 2007; and No. 2007-151746, filed Jun. 7, 2007, the entire contents of both of which are incorporated herein by reference.

BACKGROUND OF THE INVENTION

1. Field of the Invention

This invention relates to a treating liquid to be used after finishing chemical mechanical polishing (CMP) and to a method of manufacturing a semiconductor device using the treating liquid.

2. Description of the Related Art

In recent years, a trend to further promote the fineness of wirings has been rapidly advanced concomitant with a trend to further promote the integration of an LSI. Additionally, it is now considered imperative to adopt new materials for alleviating the delay of wiring RC. Under the circumstances, it is now being attempted to employ low resistant Cu ($\rho$: 1.8 $\mu\Omega$-cm) as a conductive material and to employ an insulating film of low dielectric constant (k: <2.5) as an insulating material.

The Cu wiring is mainly formed as damascene wiring by CMP. The insulating film and wiring that have been formed by CMP are inevitably accompanied with residues such as dusts (abrasive particles and shavings) and unreacted slurry. As the washing liquid to removing these residues, there have been conventionally employed those containing a chelate complexing agent and a surfactant. However, since intervals between wirings is required to be as small as 0.1 µm or less in a semiconductor device of the next generation, a trace amount of fine residues that has been considered to raise no problems up to date may cause wiring failures such as short-circuit between wirings or the deterioration in withstanding voltage of insulating film as the space between wirings is further narrowed in future.

Additionally, since most of the insulating film of low dielectric constant contains an organic component, the surface of the film is hydrophobic and hence hardly wettable to water. Therefore, dusts easily adsorb on the surface of insulating film during the CMP treatment or the washing treatment. Moreover, the dusts once adsorbed in this manner can be hardly removed, thus giving rise to failures to form wirings which are normally electrically isolated from each other. Further, the insulating film having a low dielectric constant is also accompanied with a problem that it can be easily scratched.

As the washing liquid to be employed for removing minute particles and metal impurities which are adhered to the surface of substrate, there has been conventionally proposed a treating liquid containing aliphatic polycarboxylic acid and a reducing agent. Further, there has been also proposed a treating liquid containing resin particles for performing a post-CMP treatment. There are increasingly demands that the surface of the insulating film in which a conductive material is buried, in particular, the surface of the insulating film of low dielectric constant that has been subjected to the CMP treatment is further enhanced in cleanness and also that the surface washed is enabled to advance to the next step in a stabilized state. Especially, when the semiconductor substrate is allowed to dry subsequent to the post-CMP treatment and then left to stand in an environment of clean room, the surface of conductive material is abnormally oxidized, thus raising the problem of short-circuiting of wirings.

BRIEF SUMMARY OF THE INVENTION

A post-CMP treating liquid according to one aspect of the present invention comprises water; an amphoteric surfactant; an anionic surfactant; a complexing agent; resin particles having carboxylic group and sulfonyl group on their surfaces, a primary particle diameter thereof ranging from 10 to 60 nm; and tetramethyl ammonium hydroxide; the treating liquid having a pH ranging from 4 to 9 and exhibiting a polishing rate both of an insulating film and a conductive film at a rate of 10 nm/min or less.

A post-CMP treating liquid according to another aspect of the present invention comprises water; polyphenol; an anionic surfactant; ethylene diamine tetraacetic acid; resin particles having carboxylic group and sulfonyl group on their surfaces, a primary particle diameter thereof ranging from 10 to 60 nm; and tetramethyl ammonium hydroxide; the treating liquid having a pH ranging from 4 to 9 and exhibiting a polishing rate both of an insulating film and a conductive film at a rate of 10 nm/min or less.

A method for manufacturing a semiconductor device according to another aspect of the present invention comprises depositing a conductive material above an insulating film formed above a semiconductor substrate and having a recess, thereby forming a conductive film; polishing the conductive film to expose a surface of the insulating film while burying the conductive material in the recess, thereby forming a buried wiring layer; and treating a surface of the buried wiring layer and the surface of the insulating film using a treating liquid without substantially polishing these surfaces, the treating liquid comprising water; an amphoteric surfactant; an anionic surfactant; a complexing agent; resin particles having carboxylic group and sulfonyl group on their surfaces, a primary particle diameter thereof ranging from 10 to 60 nm; and tetramethyl ammonium hydroxide; the treating liquid having a pH ranging from 4 to 9.

A method for manufacturing a semiconductor device according to another aspect of the present invention comprises depositing a conductive material above an insulating film formed above a semiconductor substrate and having a recess, thereby forming a conductive film; polishing the conductive film to expose a surface of the insulating film while burying the conductive material in the recess, thereby forming a buried wiring layer; and treating a surface of the buried wiring layer and the surface of the insulating film using a treating liquid without substantially polishing these surfaces, the treating liquid comprising water; polyphenol; an anionic surfactant; ethylene diamine tetraacetic acid; resin particles having carboxylic group and sulfonyl group on their surfaces, a primary particle diameter thereof ranging from 10 to 60 nm; and tetramethyl ammonium hydroxide; the treating liquid having a pH ranging from 4 to 9.

DETAILED DESCRIPTION OF THE INVENTION

Figure 1A:
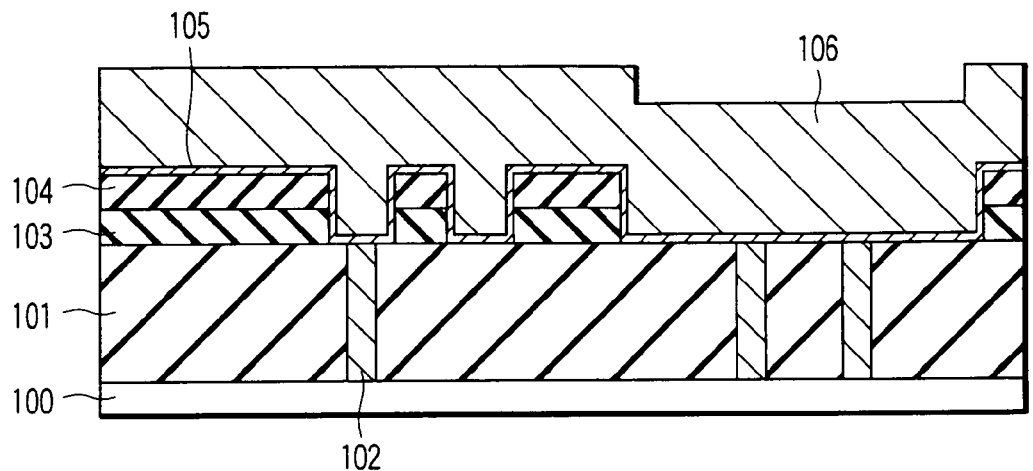
FIGS. 1A to 1C are cross-sectional views each illustrating a step in the manufacturing method of a semiconductor device according to one embodiment of the present invention.

Next, embodiments of the present invention will be explained.

The post-CMP treating liquid according to embodiments of the present invention comprises five kinds of components, the pH of the treating liquid being within a specific range.

A first post-CMP treating liquid comprises an amphoteric surfactant, an anionic surfactant, a complexing agent, resin particles, and tetramethyl ammonium hydroxide.

A first component is an amphoteric surfactant. This amphoteric surfactant dissolves a metal oxide, especially Cu oxide to suppress the generation of abnormal oxide. It can be said that this amphoteric surfactant removes a component which may become a seed for generating abnormal oxide. As this amphoteric surfactant, it can be selected from the group consisting of, for example, lauryl betaine, stearyl betaine, lauryl dimethylamine oxide, and 2-alkyl-N-carboxymethyl-N-hydroxyethyl imidazolinium betaine. These compounds may be employed singly or in combination of two kinds thereof. Because of saving cost, it is preferable to employ lauryl dimethylaminoacetic acid betaine. This lauryl dimethylaminoacetic acid betaine is advantageous in that it is high in biodegradability and hence low in load to environments.

As long as this amphoteric surfactant is included in the post-CMP treating liquid at a concentration of 0.0001 wt % or more, it is possible to derive the effects thereof. As the concentration of the amphoteric surfactant is increased, the effect of dissolving the metal oxide can be increased. However, if the metal oxide is excessively dissolved, a trench may be generated along the crystal boundary of metal. Further, the amphoteric surfactant which has been excessively incorporated may lead to the aggregation of resin particles. In order to derive desired effects without raising any of problems, the concentration of the amphoteric surfactant should preferably be within the range of 0.0001 to 0.1 wt %. More preferably, the concentration of the amphoteric surfactant should be within the range of 0.005 to 0.05 wt %.

A second component is an anionic surfactant. As this anionic surfactant, it is possible to employ a surfactant having carboxyl group or a surfactant having sulfonyl group. These surfactants may be employed singly or in combination.

As the surfactant having carboxyl group, it is possible to employ polyacrylic acid, polyacrylate, polymethacrylic acid, polymethacrylate, acrylic acid-methacrylic acid, acrylic acid-methacrylate, etc. It is also possible to employ a polyvalent carboxylic acid-based copolymer. The weight average molecular weight of these surfactants should preferably be within the range of 2000 to 20000. If the weight average molecular weight of these surfactants is less than 2000, it may become difficult to derive a sufficient washing power. On the other hand, if the weight average molecular weight of these surfactants is more than 20000, the aggregation of resin particles may generate, possibly resulting in an increase of viscosity of the treating liquid.

As the surfactant having sulfonyl group, it is possible to employ alkylbenzene sulfonate. For example, it is possible to employ hexylbenzene sulfonic acid, octylbenzene sulfonic acid, dodecylbenzene sulfonic acid, tetradecylbenzene sulfonic acid, hexadecylbenzene sulfonic acid, octadecylbenzene sulfonic acid, etc. Incidentally, because of appropriate range of molecular weight and also because of the molecular structure wherein a straight chain and a benzene ring are included therein and sulfonyl group is coordinated on the surface thereof, it is especially preferable to employ potassium dodecylbenzene sulfonate or ammonium dodecylbenzene sulfonate.

The content of the anionic surfactant should preferably be within the range of 0.01 to 1 wt % based on a total weight of the treating liquid. Even if the anionic surfactant is excessively contained, it would be impossible to obtain prominent effects. Rather, the excessive content of anionic surfactant may give rise to the problem that abrasive particles or dust such as shavings are allowed to readhere to the treated surface. As long as the content of the anionic surfactant is within the aforementioned range, it is possible to derive desired effects without raising any problems.

As will be described hereinafter, the post-CMP treating liquid according to the embodiment of the present invention comprises resin particles having, on their surfaces, two kinds of functional groups, i.e. carboxyl group and sulfonyl group. Since these functional groups are enabled to act on the metal of a treated surface, it is possible to obtain various effects. Further, since the functional groups which are similar to the aforementioned two kinds of functional group are included also in the surfactants, it is possible to further enhance these effects. As a result, the removal of water marks can be promoted.

A third component is a complexing agent. This complexing agent forms a complex with metal to promote the removal of residues through the chemical effects thereof. As the examples of this complexing agent, it can be selected from the group consisting of, for example, oxalic acid, malonic acid, succinic acid, tartaric acid, citric acid, ethylenediamine tetraacetic acid, ethylenediamine tetra(methylene phosphonic acid), nitrotris(methylene phosphonic acid) and salts thereof, glycine, alanine, triethanol amine and ammonia. These compounds may be employed singly or combination of two or more kinds.

Even if this complexing agent is contained excessively, it would be impossible to derive any of prominent effects. Rather, the inclusion of excessive quantity of this complexing agent may lead to the problem that the surface of wirings is roughened. Therefore, the content of the complexing agent should preferably be within the range of 0.01 to 1 wt %.

A fourth component is resin particles. The resin particles act to mechanically remove the residues from the treated surface.

As the materials for the resin particles, it is possible to employ, for example, poly(methyl methacrylate) (PMMA), polystyrene (PS), polyethylene (PE), polyethylene glycol, polyvinyl acetate, polybutadiene, polyisobutylene, polypropylene and polyoxymethylene. The resin particles may be formed solely of a single kind of material or formed of a combination of two or more different kinds of these resins. Further, the resin particles can be formed through the crosslinking of two or more kinds of resins.

The surfaces of the resin particles are constructed to have two kinds of functional groups, i.e. carboxylic group and sulfonyl group bonded thereto. Due to the existence of these functional groups, chelate effect is created between the resin particles and a metal such as Cu, etc., thereby enabling residues including metals to be effectively removed. These carboxylic group and sulfonyl group are capable of generating anions (—$COO^-$ and $SO_3^-$) in the treating liquid. As compared with cations, the anions are advantageous in the respects that they are excellent in safety and low in manufacturing cost.

The primary particle diameter of the resin particles is confined within the range of 10 to 60 nm. The primary particle diameter of the resin particles can be measured from the SEM or TEM photograph thereof. When the primary particle diameter of the resin particles is less than 10 nm, the quantities of these two kinds of functional groups on the surface of resin particles may become insufficient, thus making it impossible to obtain the effects thereof. On the other hand, when the primary particle diameter of the resin particles exceeds 60 nm, it may become impossible to completely remove the water marks generated on the hydrophobic surface of insulating film. Moreover, the resin particles themselves may remain on the treated surface, rendering them to become a cause for generating the defectives. More preferably, the primary particle diameter of the resin particles should be within the range of 30 to 50 nm.

The concentration of the resin particles in the post-CMP treating liquid should preferably be within the range of 0.01 to 1 wt %. If the resin particles are contained in the post CMP treating liquid at a concentration exceeding 1 wt %, the resin particles themselves leave behind after the drying process of the wiring layer, thus generating new defectives and hence badly affecting the semiconductor device. Additionally, the manufacturing cost of the treating liquid itself would be increased. On the other hand, if this concentration of the resin particles is less than 0.01 wt %, it may become impossible to completely remove the water marks. More preferably, the concentration of the resin particles should be within the range of 0.05 to 0.1 wt %.

A fifth component is tetramethyl ammonium hydroxide (TMAH). Since this TMAH is one of basic compound, it is capable of dissolving the complex of a wiring material consisting of metal such as Cu, etc. Moreover, by suitably adjusting the content of TMAH, the pH of post-CMP treating liquid can be adjusted.

Incidentally, the basic compound herein is defined to include compounds such as ethylene diamine, trimethylhydroxyethyl ammonium (choline). Even when any of these compounds is also incorporated in the treating liquid, it is possible to adjust the pH of post-CMP treating liquid to the range of 4 to 9. However, in the case of the treating liquid containing ethylene diamine for example, there will be raised a problem that the surface of a wiring material consisting of metal such as Cu may be etched away. A basic compound which is capable of adjusting the pH of post-CMP treating liquid without raising problems and, still more, capable of dissolving a complex of metal such as Cu, etc. is TMAH.

With respect to the content of TMAH, there is not any particular limitation, so that it can be suitably selected from within the range which enables to secure a pH of 4 to 9 in the post-CMP treating liquid.

When the pH of the post-CMP treating liquid is less than 4, it may become difficult to remove the resin particles. On the other hand, when the pH of the post-CMP treating liquid exceeds 9, it may raise a problem that the surface of wirings is roughened. In order to avoid these problems, the pH of post-CMP treating liquid according to one embodiment of the present invention is kept within the range of 4 to 9.

The first post-CMP treating liquid may further contain a reducing agent. As the reducing agent, it is possible to employ hydroxyl amine for example. When the pH of the treating liquid is relatively high, e.g., 8 to 9, the effect of suppressing the corrosion of a metal such as Cu can be further enhanced by the inclusion of the reducing agent. As the amount of the reducing agent, there is not any particular limitation. When the amount of the reducing agent is 0.01 wt % or more based on a total weight of the treating liquid, the aforementioned effect can be secured. However, when the reducing agent is excessively incorporated in the treating liquid, problems such as the precipitation of wiring materials may occur. Therefore, it is preferable to set the upper limit of the reducing agent to about 1 wt % based on a total weight of the treating liquid.

The components described above are mixed with water to obtain a first post-CMP treating liquid. As water, there is not any particular limitation with respect the kinds thereof and hence it is possible to employ ion-exchange water, pure water, etc.

A second post-CMP treating liquid comprises polyphenol, an anionic surfactant, ethylene diamine tetraacetic acid, resin particles, and tetramethyl ammonium hydroxide. This second post-CMP treating liquid is the same in composition with the aforementioned first post-CMP treating liquid except that polyphenol is incorporated as the first component and ethylene diamine tetraacetic acid is incorporated as the third component.

The polyphenol employed as the first component is effective in suppressing the abnormal oxidation of metal, especially Cu. Specifically, polyphenol is enabled to adhere onto the surface of the component that may become a seed for generating abnormal oxides, thereby suppressing the abnormal oxidation. This polyphenol can be selected from the group consisting of, for example, catechin, anthocyanidin, flavan-3,4-diol, proanthocyanidin, rutin, isoflavone, tannin and chlorogenic acid. As the anthocyanidin, it may be of any type selected from pelargonidin type (4'-hydroxy), cyanidin type (3',4'-dihydroxy) and delphinidin type (3',4',5'-trihydroxy).

The aforementioned compounds can be employed singly or in combination of two or more kinds. In view of excellent stability and low cost, the employment of catechin is more preferable.

As long as this polyphenol is included in the post CMP treating liquid at a concentration of 0.0001 wt % or more, it is possible to derive the effects thereof. As the concentration of the polyphenol is increased, the effect of suppressing the abnormal oxidation of Cu can be increased. However, an increased concentration of polyphenol may lead to the generation of a trench along the crystal boundary of metal. In order to derive desired effects without raising problems, the concentration of polyphenol should preferably be within the range of 0.0001 to 0.1 wt %. More preferably, the concentration of polyphenol should be within the range of 0.005 to 0.05 wt %.

As already explained above, the ethylene diamine tetraacetic acid employed as the third component is one kind of complexing agent. Even if this ethylene diamine tetraacetic acid is contained excessively, it would be impossible to derive any of prominent effects. Rather, the inclusion of excessive quantity of this ethylene diamine tetraacetic acid may lead to the problem that the surface of wirings is roughened. Therefore, the concentration of ethylene diamine tetraacetic acid should preferably be within the range of 0.01 to 1 wt %.

This ethylene diamine tetraacetic acid is high in terms of washing effects and hence is an excellent complexing agent. However, when this ethylene diamine tetraacetic acid is left contacted with metal such as Cu, there will be raised the problem that the abnormal oxidation of metal is more likely to be generated. It has been found out by the present inventors that when polyphenol is incorporated in a post-CMP treating liquid containing ethylene diamine tetraacetic acid, it is possible to suppress the abnormal oxidation of metal. Moreover, the excellent washing effects of ethylene diamine tetraacetic acid would not be damaged in any substantial manner. The reason for this may be attributed to the anti-oxidation action to be derived from this polyphenol.

Together with these polyphenol and ethylene diamine tetraacetic acid, the same kinds of other additives as employed in the first post-CMP treating liquid such as an anionic surfactant, resin particles and TMAH are mixed with water to obtain the second post-CMP treating liquid.

Incidentally, in the embodiment of the present invention, the intention is to remove residues from the surfaces of wiring layer and insulating film, the insulating film made of a material such as $SiO_2$ and the conductive film made of a material such as Cu and Ta are not required to be polished. On the contrary, in order to inhibit the polishing of these insulating film and conductive film in a treatment using the treating liquid according to embodiments of the present invention, the polishing rate of these insulating film and conductive film by the treating liquid according to embodiments of the present invention is confined to 10 nm/min or less. Irrespective of the treating conditions, the kinds of these insulating film and conductive film, as long as the polishing rate of these insulating film and conductive film is confined to 10 nm/min or less, these films are assumed not to be polished to any substantial degree, thereby making it possible to exclusively obtain desired washing effects.

In order to make sure that the polishing rate is 10 nm/min or less, it is desirable that the post-CMP treating liquid according to embodiments of the present invention does not contain any of oxidizing agents which may oxidize the surface of conductive film to promote the polishing of conductive film. Further, inorganic particles to be employed for mechanically removing oxides that have been generated on the surface of conductive film or for mechanically removing an insulating film should be excluded from the post-CMP treating liquid according to embodiments.

The treating liquid as described above is fed to the surface of object after finishing the CMP thereof and at the same time, mechanical action is applied to the surface using a suitable member such as a polishing pad, rolls or pencil, thereby removing residual matters from the surface of the wiring layer and insulating layer, thus obtaining a semiconductor device excellent in electric properties.

Next, one example for forming a Cu damascene wiring by the method according to one embodiment of the present invention will be explained.

Figure 1B:
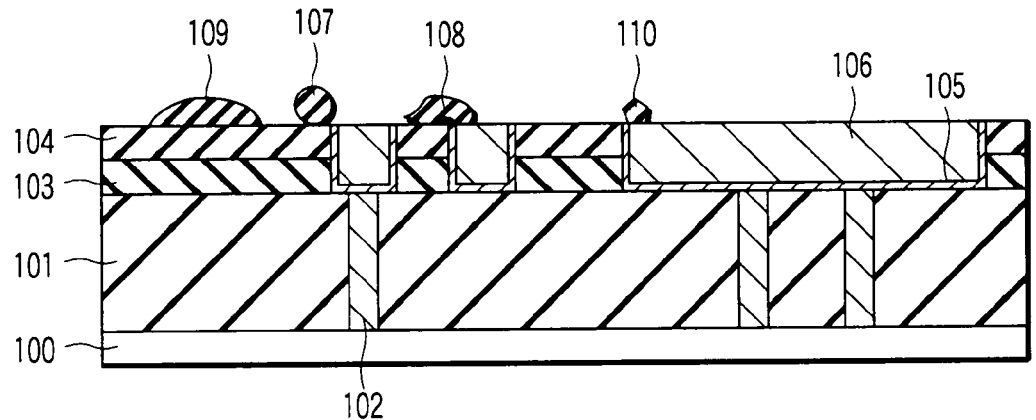
Figure 1C:
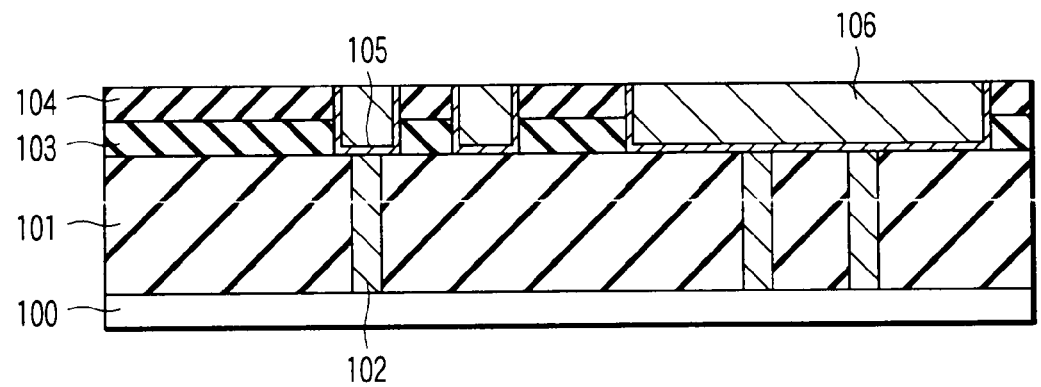

FIGS. 1A to 1C are cross-sectional views each illustrating a step in the method according to one embodiment of the present invention.

First of all, as shown in FIG. 1A, a barrier metal film 105 and an wiring material film 106 are successively formed, via an inorganic insulating film 101 and laminated insulating films 103 and 104, on a semiconductor substrate 100 having elements (not shown) formed therein.

In the inorganic film 101, plugs 102 made of W (tungsten) are buried. The laminated insulating films are constituted by a first insulating film 103 having a relative dielectric constant of less than 2.5, and a second insulating film 104 having a higher relative dielectric constant than that of the first insulating film 103. The film thickness of the first insulating film as well as of the second insulating film may be 100 nm.

The first insulating film 103 may be formed of at least one selected from the group consisting of a film having a siloxane skeleton such as polysiloxane, hydrogen silsesquioxane, polymethyl siloxane and methylsilsesquioxane; a film formed, as a major component, of an organic resin such as polyarylene ether, polybenzoxazole and polybenzocyclobutane; and a porous film such as a porous silica film. The first insulating film made of these materials is fragile.

The second insulating film 104 to be formed on the first insulating film 103 acts as a capping insulating film and can be formed by at least one insulating material having a relative dielectric constant of 2.5 or more and selected from the group consisting, for example, of SiC, SiCH, SiCN, SIOC, SiN and SiOCH. The surface of the second insulating film 104 constituted by any of these materials is hydrophobic. Further, even on the surface of a hydrophilic insulating film such as SiO, SIOP, SIOF and SION, residual matters are enabled to adhere thereto after finishing the process of CMP. Even to such an insulating film, the treating liquid according to one embodiment of the present invention can be suitably applied.

The barrier metal film 105 and the wiring material film 106 are deposited on the aforementioned laminated insulating films having a wiring trench formed therein. The barrier metal film 105 may be deposited to a thickness of 10 nm using Ta. The wiring material film 106 may be deposited to a thickness of 400 nm using Cu.

Incidentally, in the example shown in FIG. 1A, although the insulating film on which the barrier metal film 105 and the wiring material film 106 are formed is constituted by a laminate structure comprising the first insulating film 103 and the second insulating film 104, this insulating film may be constituted by a single layer of insulating film. The insulating film in this case may be formed using black diamond (Applied Materials Co., Ltd.), etc. The surface of the insulating film formed of such a material is also hydrophobic.

Then, redundant portions of the barrier metal film 105 and the wiring material film 106 are removed by CMP, thereby exposing the surface of the second insulating film 104 as shown in FIG. 1B. The CMP of conductive film such as the barrier metal film 105 and the wiring material film 106 can be performed by the oxidation of the surfaces of these films to form fragile oxide and then by the mechanical removal of this fragile oxide. Incidentally, in this CMP, the removal of the wiring material film 106 (1st polishing) and the removal of the barrier metal film 105 (2nd polishing) were performed in two steps, the conditions thereof being as shown below.

(1st polishing)
Slurry: CMS7401/7452 (JSR Co., Ltd.)
Flow rate: 300 cc/min.
Polishing pad: IC1000 (Nitta Haas Co., Ltd.)
Load: 300 gf/cm².

The rotational speeds of the carrier and the table were both set to 100 rpm and the polishing was performed for one minute.

(2nd polishing)
Slurry: CMS8401/8452 (JSR Co., Ltd.)
Flow rate: 200 cc/min.
Polishing pad: IC1000 (Nitta Haas Co., Ltd.)
Load: 300 gf/cm².

The rotational speeds of the carrier and the table were both set to 100 rpm and the polishing was performed for 30 seconds.

Residues such as abrasive grains 107, polished debris or products 108 and water marks 109 were found adhered to the surfaces of the second insulating film 104, the barrier metal film 105 and the wiring material film 106 immediately after the 2nd polishing as shown in FIG. 1B. The residues such as abrasive grains 107, polished debris 108 and water marks 109 adhered in this manner would become a cause for generating defectives.

By subjecting the resultant surface to washing (post-CMP treatment) with a treating liquid, these residues thus adhered can be removed as shown in FIG. 1C. In the case of the conventional washing liquid however, when a semiconductor substrate is allowed to dry after finishing the post-CMP treatment and left to stand in an environment of clean room for 24 hours, the surface of the wiring material is abnormally oxidized, thus raising a problem that abnormal oxide 110 is created thereon.

It is possible, through the employment of the post-CMP treating liquid according to embodiments of the present invention, to remove various kinds of adhered matters and to suppress the generation of abnormal oxide 110.

The treating liquid according to the embodiment of the present invention was prepared according to the following procedures.

Example I-1

The components were respectively blended with water according to the following recipe to prepare the treating liquid of Example I-1. The treating liquid thus obtained exhibited a pH of 4.

Amphoteric surfactant: Lauryl dimethylaminoacetic acid betaine—0.005 wt %

Anionic surfactant: Ammonium polyacrylate—0.1 wt %

Ammonium dodecylbenzene sulfonate—0.1 wt %

Complexing agent: Glycine—0.05 wt %

Resin particles: PMMA-polystyrene crosslinked particles (primary particle diameter: 50 nm) having carboxyl group and sulfonyl group on their surfaces—0.1 wt %

TMAH—0.03 wt %

Example I-2

The treating liquid of Example I-2 was prepared in the same manner as described in Example I-1 except that the amphoteric surfactant was changed to lauryl dimethylamine oxide, the content of which being 0.008 wt %.

Example I-3

The treating liquid of Example I-3 was prepared in the same manner as described in Example I-1 except that potassium polyacrylate was substituted for ammonium polyacrylate employed as an anionic surfactant.

Example I-4

The treating liquid of Example I-4 was prepared in the same manner as described in Example I-1 except that only 0.1 wt % of ammonium polyacrylate was employed as an anionic surfactant.

Example I-5

The treating liquid of Example I-5 was prepared in the same manner as described in Example I-1 except that only 0.1 wt % of ammonium dodecylbenzene sulfonate was employed as an anionic surfactant.

Example I-6

The treating liquid of Example I-6 was prepared in the same manner as described in Example I-1 except that the complexing agent was changed to alanine, the content of which being 0.08 wt %.

Examples I-7 to I-12

The treating liquids of Examples I-7, I-8, I-9, I-10, I-11 and I-12 were prepared in the same manner as described in Example I-1 except that the content of amphoteric surfactant was changed to 0.0005, 0.001, 0.01, 0.05, 0.1 and 0.5 wt %, respectively.

Example I-13

The treating liquid of Example I-13 was prepared in the same manner as described in Example I-1 except that the primary particle diameter of the resin particles was changed to 10 nm.

Example I-14

The treating liquid of Example I-14 was prepared in the same manner as described in Example I-1 except that the primary particle diameter of the resin particles was changed to 60 nm.

Example I-15

The treating liquid of Example I-15 was prepared in the same manner as described in Example I-1 except that the material of the resin particles was changed to polystyrene.

Examples I-16 to I-20

The treating liquids of Examples I-16, I-17, I-18, I-19 and I-20 were prepared in the same manner as described in Example I-1 except that the pH thereof was changed to 5, 6, 7, 8 and 9, respectively.

Example I-21

The treating liquid of Example I-21 was prepared in the same manner as described in Example I-20 except that 0.1 wt % of hydroxylamine was additionally incorporated therein as a reducing agent.

Using each of these treating liquids thus obtained in Examples I-1 to I-21, the surface having the features as shown in FIG. 1B was washed. The washing was performed by contacting a polishing pad (Nitta Haas Co., Ltd.) with the surface to be treated while feeding a treating liquid to the polishing pad under the following conditions, in which the surface to be treated (hereinafter referred to as a treated surface) was rubbed by the polishing pad for 30 seconds.

Flow rate of washing liquid: 300 cc/min.

Load: 300 gf/cm$^2$.

Rotational speeds of the carrier and the table: both 100 rpm.

Subsequently, the treating liquid was replaced by pure water and washing was continued under the same conditions as described above, thus subjecting the treated surface to rubbing for 30 seconds. Finally, the treated surface was subjected to spin-rinse drying.

The surface having the features as shown in FIG. 1B was washed in the same manner as described above except that the treating liquids as described below were employed, these washing experiments being referred to as Comparative Examples I-1 to I-13. The treating liquids employed in these comparative examples were prepared in the same manner as described in Example I-1 except the changes in recipe as pointed out below.

Comparative Example I-1

The amphoteric surfactant was not incorporated.

Comparative Example I-2

The amphoteric surfactant was changed to ethylene diamine tetraacetic acid, the content of which being 0.05 wt %.

Comparative Example I-3

The anionic surfactant was not incorporated.

Comparative Example I-4

The anionic surfactant was changed to lauryl trimethyl ammonium chloride acting as a cationic surfactant.

Comparative Example I-5

The complexing agent was not incorporated.

Comparative Example I-6

The resin particles were not incorporated.

Comparative Example I-7

The primary particle diameter of the resin particles was changed to 8 nm.

Comparative Example I-8

The primary particle diameter of the resin particles was changed to 80 nm.

Comparative Example I-9

The resin particles having only carboxyl group on their surfaces was employed.

Comparative Example I-10

The resin particles having only sulfonyl group on their surfaces was employed.

Comparative Example I-11

The TMAH was changed to ethylene diamine.

Comparative Example I-12

The pH was changed to 3.

Comparative Example I-13

The pH was changed to 10.

Incidentally, the ethylene diamine tetraacetic acid employed in Comparative Example I-2 is weakly cationic and is known to be effective in dissolving metal oxide. In Comparative Example I-11, the pH was 4. Further, in Comparative Examples I-12 and I-13, the pH thereof was controlled to a predetermined value through the adjustment of the content of TMAH.

After the washing treatment, the measurement of light field defectives in a region (174.25 cm$^2$/wafer) on a pattern wafer was performed. As the kinds of defectives assessed herein, they included dust and scratches observed generally after the CMP thereof in addition to the water mark (WM) on the insulating film and the residues of resin particles remaining on the entire surface thus treated. Incidentally, the dust and scratches were investigated throughout the entire surface thus treated. Additionally, the assessment of defectives on the surface of pattern wafer was performed 24 hours later to investigate the presence or absence of abnormal oxide on the surface of Cu film.

As for the water marks, residues of particles, dust and scratches, they were assessed based on the number thereof that had been confirmed on the Cu film and the insulating film and were judged according to the following criterion.

Removal of water marks: zero—◯; one to less than ten—Δ; ten or more—X.

Residues of particles: zero—◯; one to less than ten—Δ; ten or more—X.

Dust particles: less than five—◯; five to less than 20—Δ; 20 or more—X.

Scratches: less than five—◯; five to less than 20—Δ; 20 or more—X.

The presence or absence of abnormal oxide was assessed based on the number thereof that had been confirmed on the Cu film and was judged according to the following criterion.

Zero—◯; one to less than ten—Δ; ten or more—X.

Even if the number of mark "X" is limited to one in these five kinds of assessment of the treating liquid, the treating liquid was considered unacceptable. Further, if the number of mark "Δ" is limited to not more than two, the treating liquid was considered acceptable.

The results thus obtained are summarized in the following Tables 1 and 2.

TABLE 1

| Exs. | WM | Residual particles | Dusts | Scratches | Abnormal oxidation of Cu |
|---|---|---|---|---|---|
| I-1 | ◯ | ◯ | ◯ | ◯ | ◯ |
| I-2 | ◯ | ◯ | ◯ | ◯ | ◯ |
| I-3 | ◯ | ◯ | ◯ | ◯ | ◯ |
| I-4 | ◯ | ◯ | ◯ | ◯ | Δ |
| I-5 | ◯ | ◯ | Δ | ◯ | ◯ |
| I-6 | ◯ | ◯ | ◯ | ◯ | ◯ |
| I-7 | ◯ | ◯ | ◯ | ◯ | Δ |
| I-8 | ◯ | ◯ | ◯ | ◯ | Δ |
| I-9 | ◯ | ◯ | ◯ | ◯ | ◯ |
| I-10 | ◯ | ◯ | ◯ | ◯ | ◯ |
| I-11 | ◯ | ◯ | ◯ | ◯ | Δ |
| I-12 | ◯ | Δ | ◯ | ◯ | Δ |
| I-13 | ◯ | ◯ | ◯ | ◯ | ◯ |
| I-14 | ◯ | ◯ | ◯ | ◯ | ◯ |
| I-15 | ◯ | ◯ | ◯ | ◯ | ◯ |
| I-16 | ◯ | ◯ | ◯ | ◯ | ◯ |
| I-17 | ◯ | ◯ | ◯ | ◯ | ◯ |
| I-18 | ◯ | ◯ | ◯ | ◯ | ◯ |
| I-19 | ◯ | Δ | ◯ | ◯ | ◯ |
| I-20 | ◯ | ◯ | ◯ | ◯ | Δ |
| I-21 | ◯ | ◯ | ◯ | ◯ | ◯ |

TABLE 2

| Comp. Exs. | WM | Residual particles | Dusts | Scratches | Abnormal oxidation of Cu |
|---|---|---|---|---|---|
| I-1 | ◯ | ◯ | ◯ | ◯ | X |
| I-2 | ◯ | X | Δ | Δ | Δ |
| I-3 | X | Δ | X | ◯ | X |
| I-4 | X | X | X | ◯ | Δ |

TABLE 2-continued

| Comp. Exs. | WM | Residual particles | Dusts | Scratches | Abnormal oxidation of Cu |
|---|---|---|---|---|---|
| I-5 | X | X | ○ | ○ | X |
| I-6 | X | ○ | X | ○ | X |
| I-7 | Δ | X | Δ | ○ | ○ |
| I-8 | X | Δ | ○ | ○ | ○ |
| I-9 | X | ○ | Δ | ○ | ○ |
| I-10 | X | ○ | Δ | ○ | ○ |
| I-11 | Δ | ○ | X | ○ | Δ |
| I-12 | ○ | X | ○ | ○ | ○ |
| I-13 | ○ | ○ | ○ | ○ | X |

As shown in above Table 1, when the treated surface was treated using treating liquids each containing prescribed components and exhibiting a pH ranging from 4 to 9 (Examples I-1 to I-21), it was possible to minimize the residues or defectives on the resultant surface thus treated and to suppress the generation of abnormal oxidation of Cu.

Incidentally, in every examples, the polishing rate of the wiring material film 106 was about 1 nm/min and the polishing rate of the second insulating film 104 was about 1 nm/min.

In view of these results, it was assumed that when the treating liquid was constructed as represented by these Examples, it was possible to effectively remove residues through mechanical action without imposing excessive loads on a hydrophobic fragile insulating film having low dielectric constant. Especially, it was possible to suppress the generation of abnormal oxidation on the surface of Cu film that may bring about the deterioration of electric properties and to prevent scratching.

Whereas, in the cases of the treating liquids of Comparative Examples, they were all incapable of sufficiently suppressing the generation of defectives. Specifically, in the case where an amphoteric surfactant was not incorporated in the treating liquid (Comparative Example I-1), it was impossible to suppress the generation of abnormal oxidation of Cu. In the case where ethylene diamine tetraacetic acid was incorporated in the treating liquid (Comparative Example I-2), a great amount of residual particles were left behind and it was impossible to reduce dust, scratches and abnormal oxidation of Cu in spite of the fact that ethylene diamine tetraacetic acid is inherently capable of dissolving metal oxide. It was assumed that due to this compound, aggregation of resin particles was caused to occur, resulting in the generation of defectives.

In the case where an anionic surfactant was not incorporated in the treating liquid (Comparative Example I-3), it was impossible to suppress not only the abnormal oxidation but also the generation of water marks and dust. In the case where a cationic surfactant was employed in place of the anionic surfactant (Comparative Example I-4), abrasive particles and dust such as shavings were re-adhered to the treated surface and the generation of water marks originated from these particles and dust acting as a seed was promoted. In the case where a complexing agent was not incorporated in the treating liquid (Comparative Example I-5), it was impossible not only to suppress the generation of defectives but also to sufficiently remove the residual particles.

In the case where resin particles were not incorporated in the treating liquid (Comparative Example I-6), it was impossible not only to suppress the abnormal oxidation but also to minimize the generation of water marks and dust. In the case where the primary particle diameter of resin particles was too small (Comparative Example I-7), it was impossible to sufficiently remove the residual particles. On the other hand, in the case where the primary particle diameter of resin particles was too large (Comparative Example I-8), it was impossible to sufficiently remove the water marks.

In the case where the functional group existing on the surface of resin particle was limited to one kind (Comparative Examples I-9 and I-10), it was impossible to bring about a chelating action with the residual matters containing metal, thus making it impossible to enhance the capacity of the treating liquid to remove the residual dust and water marks.

In the case where another kind of basic compound was employed in place of TMAH (Comparative Examples I-11), it was impossible to sufficiently remove the residual dust. Even if all of predetermined components were incorporated in the treating liquid (Comparative Examples I-12 and I-13), it was impossible to sufficiently remove the residual particles and to suppress the generation of abnormal oxidation provided that the pH thereof was less than 4 or more than 9.

It was confirmed from these results that as long as the treating liquid was formulated to include an amphoteric surfactant, an anionic surfactant, a complexing agent, TMAH and resin particles having a primary particle diameter within a specific range and specific functional groups on their surfaces, wherein the treating liquid was also formulated to exhibit a pH ranging from 4 to 9, it was possible to derive excellent effects from the treating liquid.

Example II-1

The components were respectively blended with water according to the following recipe to prepare the treating liquid of Example II-1. The treating liquid thus obtained exhibited a pH of 4.

Polyphenol: Catechin—0.005 wt %
Anionic surfactant: Ammonium polyacrylate—0.1 wt %
Ammonium dodecylbenzene sulfonate—0.1 wt %
Ethylene diamine tetraacetic acid—0.05 wt %
Resin particles: PMMA-polystyrene crosslinked particles (primary particle diameter: 50 nm) having carboxyl group and sulfonyl group on their surfaces—0.1 wt %
TMAH—0.03 wt %

Example II-2

The treating liquid of Example II-2 was prepared in the same manner as described in Example II-1 except that the catechin employed as polyphenol was changed to rutin, the content of which being 0.005 wt %.

Example II-3

The treating liquid of Example II-3 was prepared in the same manner as described in Example II-1 except that potassium polyacrylate was substituted for ammonium polyacrylate employed as an anionic surfactant.

Example II-4

The treating liquid of Example II-4 was prepared in the same manner as described in Example II-1 except that only 0.1 wt % of ammonium polyacrylate was employed as an anionic surfactant.

Example II-5

The treating liquid of Example II-5 was prepared in the same manner as described in Example II-1 except that only 0.1 wt % of ammonium dodecylbenzene sulfonate was employed as an anionic surfactant.

Example II-6 to II-11

The treating liquids of Examples II-6, II-7, II-8, II-9, II-10 and II-11 were prepared in the same manner as described in Example II-1 except that the concentration of polyphenol was changed to 0.0001, 0.0005, 0.001, 0.01, 0.05 and 0.1 wt %, respectively.

Example II-12

The treating liquid of Example II-12 was prepared in the same manner as described in Example II-1 except that the primary particle diameter of the resin particles was changed to 10 nm.

Example II-13

The treating liquid of Example II-13 was prepared in the same manner as described in Example II-1 except that the primary particle diameter of the resin particles was changed to 60 nm.

Example II-14

The treating liquid of Example II-14 was prepared in the same manner as described in Example II-1 except that the material of the resin particles was changed to polystyrene.

Examples II-15 to II-19

The treating liquids of Examples II-15, II-16, II-17, II-18 and II-19 were prepared in the same manner as described in Example II-1 except that the pH thereof was changed to 5, 6, 7, 8 and 9, respectively.

Using each of these treating liquids thus obtained in Examples II-1 to II-19, the surface having the features as shown in FIG. 1B was washed. The washing was performed by contacting a polishing pad (Nitta Haas Co., Ltd.) with the treated surface while feeding a treating liquid to the surface of polishing pad under the following conditions, in which the treated surface was rubbed by the polishing pad for 30 seconds.

Flow rate of washing liquid: 300 cc/min.

Load: 300 gf/cm$^2$.

Rotational speeds of the carrier and the table: both 100 rpm.

Subsequently, the treating liquid was replaced by pure water and washing was continued under the same conditions as described above, thus subjecting the treated surface to rubbing for 30 seconds. Finally, the treated surface was subjected to spin-rinse drying.

The surface having the features as shown in FIG. 1B was washed in the same manner as described above except that the treating liquids as described below were employed, these washing experiments being referred to as Comparative Examples II-1 to II-12. The treating liquids employed in these comparative examples were prepared in the same manner as described in Example II-1 except the changes in recipe as pointed out below.

Comparative Example II-1

Polyphenol was not incorporated.

Comparative Example II-2

Polyphenol was changed to benzotriazole (BTA), the content of which being 0.05 wt %.

Comparative Example II-3

The anionic surfactant was not incorporated.

Comparative Example II-4

Ethylene diamine tetraacetic acid was not incorporated.

Comparative Example II-5

The resin particles were not incorporated.

Comparative Example II-6

The primary particle diameter of the resin particles was changed to 8 nm.

Comparative Example II-7

The primary particle diameter of the resin particles was changed to 80 nm.

Comparative Example II-8

The resin particles having only carboxyl group on their surfaces was employed.

Comparative Example II-9

The resin particles having only sulfonyl group on their surfaces was employed.

Comparative Example II-10

The TMAH was changed to ethylene diamine.

Comparative Example II-11

The pH was changed to 3.

Comparative Example II-12

The pH was changed to 10.

Incidentally, the BTA employed in Comparative Example II-2 is known to be effective as a corrosion inhibitor for metal. In Comparative Example II-10, the pH was 4. Further, in Comparative Examples II-11 and II-12, the pH thereof was controlled to a predetermined value through the adjustment of the content of TMAH.

After the washing treatment, the measurement of light field defectives in a region (174.25 cm$^2$/wafer) on a pattern wafer was performed. As for the kinds of defectives assessed herein, they included dust and scratches observed generally after the CMP thereof in addition to the water marks on the insulating film and the residues of resin particles remaining on the entire surface thus treated. Incidentally, the dust and scratches were investigated throughout the entire surface thus treated. Additionally, the assessment of defectives on the surface of pattern wafer was performed 24 hours later to investigate the presence or absence of abnormal oxide on the surface of Cu film.

As for the water marks, residues of particles, dust and scratches, they were assessed based on the number thereof that had been confirmed on the Cu film and the insulating film and were judged according to the aforementioned criterion.

The results thus obtained are summarized in the following Tables 3 and 4.

TABLE 3

| Exs. | WM | Residual particles | Dusts | Scratches | Abnormal oxidation of Cu |
|---|---|---|---|---|---|
| II-1 | ○ | ○ | ○ | ○ | ○ |
| II-2 | ○ | ○ | ○ | ○ | ○ |
| II-3 | ○ | ○ | ○ | ○ | ○ |
| II-4 | ○ | ○ | Δ | ○ | Δ |
| II-5 | ○ | ○ | Δ | ○ | Δ |
| II-6 | ○ | ○ | ○ | ○ | Δ |
| II-7 | ○ | ○ | ○ | ○ | Δ |
| II-8 | ○ | ○ | ○ | ○ | Δ |
| II-9 | ○ | ○ | ○ | ○ | ○ |
| II-10 | ○ | ○ | ○ | ○ | ○ |
| II-11 | ○ | Δ | ○ | ○ | Δ |
| II-12 | ○ | ○ | ○ | ○ | ○ |
| II-13 | ○ | ○ | ○ | ○ | ○ |
| II-14 | ○ | ○ | ○ | ○ | ○ |
| II-15 | ○ | ○ | ○ | ○ | ○ |
| II-16 | ○ | ○ | ○ | ○ | ○ |
| II-17 | ○ | ○ | ○ | ○ | ○ |
| II-18 | ○ | Δ | ○ | ○ | ○ |
| II-19 | ○ | ○ | ○ | ○ | Δ |

TABLE 4

| Comp. Exs. | WM | Residual particles | Dusts | Scratches | Abnormal oxidation of Cu |
|---|---|---|---|---|---|
| II-1 | ○ | ○ | ○ | ○ | X |
| II-2 | ○ | X | Δ | Δ | ○ |
| II-3 | X | Δ | X | ○ | X |
| II-4 | X | X | ○ | ○ | X |
| II-5 | X | ○ | X | ○ | X |
| II-6 | Δ | X | Δ | ○ | ○ |
| II-7 | X | Δ | ○ | ○ | ○ |
| II-8 | X | ○ | X | ○ | ○ |
| II-9 | X | ○ | X | ○ | ○ |
| II-10 | Δ | ○ | X | ○ | Δ |
| II-11 | ○ | X | ○ | ○ | ○ |
| II-12 | ○ | ○ | ○ | ○ | X |

As shown in above Table 3, when the treated surface was treated using treating liquids each containing prescribed components and exhibiting a pH ranging from 4 to 9 (Examples II-1 to II-19), it was possible to minimize the residues or defectives on the resultant surface thus treated and to suppress the generation of abnormal oxidation of Cu.

Incidentally, in every examples, the polishing rate of the wiring material film 106 was about 1 nm/min and the polishing rate of the second insulating film 104 was about 1 nm/min.

In view of these results, it was assumed that when the treating liquid was constructed as represented by these Examples, it was possible to effectively remove residues through mechanical action without imposing excessive loads on a hydrophobic fragile insulating film having low dielectric constant. Especially, it was possible to suppress the generation of abnormal oxidation on the surface of Cu film that may bring about the deterioration of electric properties and to prevent scratching.

Whereas, in the cases of the treating liquids of Comparative Examples, they were all incapable of sufficiently suppressing the generation of defectives. Specifically, in the case where polyphenol was not incorporated in the treating liquid (Comparative Example II-1), it was impossible to suppress the generation of abnormal oxidation of Cu. In the case where BTA was incorporated in the treating liquid (Comparative Example II-2), a great amount of residual particles were left behind and it was impossible to sufficiently reduce dust and scratches in spite of the fact that BTA is effective in preventing the corrosion of metal. It was assumed that due to this compound, aggregation of resin particles was caused to occur, resulting in the generation of defectives.

In the case where an anionic surfactant was not incorporated in the treating liquid (Comparative Example II-3), it was impossible to suppress not only the abnormal oxidation but also the generation of water marks and dust. In the case where ethylene diamine tetraacetic acid was not included in the treating liquid (Comparative Example II-4), it was impossible not only to suppress the generation of defectives but also to sufficiently remove the residual particles.

In the case where resin particles were not incorporated in the treating liquid (Comparative Example II-5), it was impossible not only to suppress the abnormal oxidation but also to minimize the generation of water marks and dust. In the case where the primary particle diameter of resin particles was too small (Comparative Example II-6), it was impossible to sufficiently remove the residual particles. On the other hand, in the case where the primary particle diameter of resin particles was too large (Comparative Example II-7), it was impossible to sufficiently remove the water marks.

In the case where the functional group existing on the surface of resin particle was limited to one kind (Comparative Examples II-8 and II-9), it was impossible to bring about a chelating action with the residual matters containing metal, thus making it impossible to enhance the capacity of the treating liquid to remove the residual dust and water marks.

In the case where another kind of basic compound was employed in place of TMAH (Comparative Examples II-10), it was impossible to sufficiently remove the residual dust. Even if all of predetermined components were incorporated in the treating liquid (Comparative Examples II-11 and II-12), it was impossible to sufficiently remove the residual particles and to suppress the generation of abnormal oxidation provided that the pH thereof was less than 4 or more than 9.

It was confirmed from these results that as long as the treating liquid was formulated to include polyphenol, an anionic surfactant, ethylene diamine tetraacetic acid, TMAH and resin particles having a primary particle diameter within a specific range and specific functional groups on their surfaces, wherein the treating liquid was also formulated to exhibit a pH ranging from 4 to 9, it was possible to derive excellent effects from the treating liquid.

As described above, the treating liquids according to embodiments of the present invention are prominently effective in suppressing the generation of abnormal oxidation of metal and also effective in removing water marks and dust and in suppressing scratching.

Although the embodiment of the present invention are explained with reference to examples of post-treatment after finishing the Cu-CMP, it should be construed that the present invention is not confined to these examples. The treating liquid comprising five kinds of components employed herein can be also applied likewise to the formation of buried electrodes, wirings and plugs where Al, W and polysilicon are employed, thus obtaining almost the same effects as described above. Further, the treating liquid of the embodiment of the present invention can be also applied to the post-treatment after CMP of $SiO_2$ employed as an insulating film to be formed on the wiring layer or in an element isolation region, making it possible to effectively wash it to obtain a clean surface thereof.

According to one aspect of the present invention, it is possible to provide a post-CMP treating liquid which is capable of effectively removing the residues adhered to the surfaces of the wiring material layer and insulating layer and which is also excellent in suppressing the generation of abnormal oxidation of conductive material. According to another aspect of the present invention, it is possible to provide a method for manufacturing a semiconductor device using this post CMP treating liquid.

According to the present invention, it is possible to manufacture a semiconductor device having high performance and high speed, which is provided with a wiring having a design rule of 0.05 µm or less which is required in a semiconductor device of the next generation, thus presenting enormous industrial values.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising:
   depositing a conductive material above an insulating film formed above a semiconductor substrate and having a recess, thereby forming a conductive film;
   polishing the conductive film to expose a surface of the insulating film while burying the conductive material in the recess, thereby forming a buried wiring layer; and
   treating a surface of the buried wiring layer and the surface of the insulating film using a treating liquid without substantially polishing these surfaces, the treating liquid comprising water; an amphoteric surfactant; an anionic surfactant; a complexing agent; resin particles having carboxylic group and sulfonyl group on their surfaces, a primary particle diameter thereof ranging from 10 to 60 nm; and tetramethyl ammonium hydroxide; the treating liquid having a pH ranging from 4 to 9.

2. The method according to claim 1, wherein the insulating film is formed of an insulating material selected from the group consisting of SiC, SiCH, SiCN, SiOC, SiN and SiOCH.

3. The method according to claim 1, wherein the conductive film comprises a barrier metal film and a Cu film.

4. The method according to claim 1, wherein the amphoteric surfactant includes at least one selected from the group consisting of lauryl betaine, stearyl betaine, lauryl dimethylamine oxide, and 2-alkyl-N-carboxymethyl-N-hydroxyethyl imidazolinium betaine.

5. The method according to claim 1, wherein the amphoteric surfactant is lauryl dimethylaminoacetic acid betaine.

6. A method for manufacturing a semiconductor device comprising:
   depositing a conductive material above an insulating film formed above a semiconductor substrate and having a recess, thereby forming a conductive film;
   polishing the conductive film to expose a surface of the insulating film while burying the conductive material in the recess, thereby forming a buried wiring layer; and
   treating a surface of the buried wiring layer and the surface of the insulating film using a treating liquid without substantially polishing these surfaces, the treating liquid comprising water; polyphenol; an anionic surfactant; ethylene diamine tetraacetic acid; resin particles having carboxylic group and sulfonyl group on their surfaces, a primary particle diameter thereof ranging from 10 to 60 nm; and tetramethyl ammonium hydroxide; the treating liquid having a pH ranging from 4 to 9.

7. The method according to claim 6, wherein the insulating film is formed of an insulating material selected from the group consisting of SiC, SiCH, SiCN, SiOC, SiN and SiOCH.

8. The method according to claim 6, wherein the conductive film comprises a barrier metal film and a Cu film.

9. The method according to claim 6, wherein the polyphenol is selected from the group consisting of catechin, anthocyanidin, flavan-3,4-diol, proanthocyanidin, rutin, isoflavone, tannin and chlorogenic acid.

* * * * *